United States Patent
Lu et al.

(10) Patent No.: US 10,551,471 B2
(45) Date of Patent: Feb. 4, 2020

(54) DATA MINING BASED APPROACH FOR ONLINE CALIBRATION OF PHASOR MEASUREMENT UNIT (PMU)

(71) Applicants: Xiao Lu, Nanjing (CN); Xinan Wang, Santa Clara, CA (US); Di Shi, San Jose, CA (US); Zhiwei Wang, Santa Clara, CA (US); Jianyu Luo, Nanjing (CN); Chunlei Xu, Nanjing (CN)

(72) Inventors: Xiao Lu, Nanjing (CN); Xinan Wang, Santa Clara, CA (US); Di Shi, San Jose, CA (US); Zhiwei Wang, Santa Clara, CA (US); Jianyu Luo, Nanjing (CN); Chunlei Xu, Nanjing (CN)

(73) Assignee: GEIRI North America, San Jose, CA (US)

( * ) Notice: Subject to any disclaimer, the term of this patent is extended or adjusted under 35 U.S.C. 154(b) by 257 days.

(21) Appl. No.: 15/787,365

(22) Filed: Oct. 18, 2017

(65) Prior Publication Data
US 2018/0156886 A1   Jun. 7, 2018

Related U.S. Application Data

(60) Provisional application No. 62/429,898, filed on Dec. 5, 2016.

(51) Int. Cl.
*G01R 19/25*   (2006.01)
*G01R 35/00*   (2006.01)

(52) U.S. Cl.
CPC ....... *G01R 35/005* (2013.01); *G01R 19/2513* (2013.01)

(58) Field of Classification Search
CPC .. G01R 19/2513; G01R 35/005; G01R 25/00; G01R 21/133; G01R 31/086;
(Continued)

(56) References Cited

U.S. PATENT DOCUMENTS 3,808,409 A * 4/1974 Enns ................. G06G 7/63
703/3
3,883,724 A * 5/1975 Pradhan .............. G06G 7/63
703/3
(Continued)

*Primary Examiner* — John E Breene
*Assistant Examiner* — Jeffrey P Aiello
(74) *Attorney, Agent, or Firm* — Limin Wen

(57) ABSTRACT

Data quality of Phasor Measurement Unit (PMU) is receiving increasing attention as it has been identified as one of the limiting factors that affect many wide-area measurement system (WAMS) based applications. In general, existing PMU calibration methods include offline testing and model based approaches. However, in practice, the effectiveness of both is limited due to the very strong assumptions employed. This invention presents a novel framework for online error detection and calibration of PMU measurement using density-based spatial clustering of applications with noise (DBSCAN) based on much relaxed assumptions. With a new problem formulation, the proposed data mining based methodology is applicable across a wide spectrum of practical conditions and one side-product of it is more accurate transmission line parameters for the energy management system (EMS) database and protective relay settings. Case studies are presented to demonstrate the effectiveness of the proposed method.

2 Claims, 11 Drawing Sheets

Figure 1:
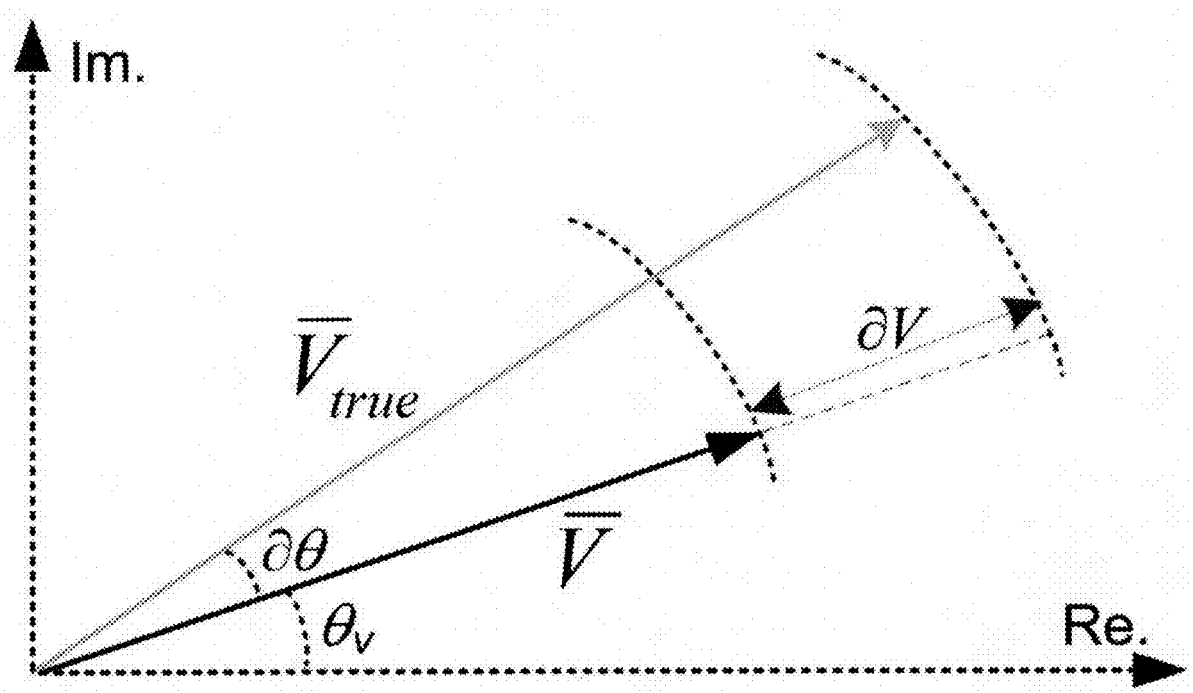

(58) Field of Classification Search
CPC ....... G01R 22/10; Y02E 60/728; Y02E 60/74; H02J 2003/007; Y04S 10/265
USPC ....... 307/104; 324/521, 601; 702/58, 59, 60, 702/65, 85, 186; 700/286
See application file for complete search history.

(56) References Cited

U.S. PATENT DOCUMENTS

| | | | | |
|---|---|---|---|---|
| 5,517,422 | A * | 5/1996 | Ilic | H02J 3/06 307/57 |
| 10,230,239 | B2 * | 3/2019 | Feng | G05F 1/70 |
| 10,284,373 | B2 * | 5/2019 | Faruque | H04L 9/3242 |
| 10,296,988 | B2 * | 5/2019 | Mitra | G06Q 50/06 |
| 2014/0142862 | A1 * | 5/2014 | Umeno | G06Q 50/06 702/19 |
| 2015/0073735 | A1 * | 3/2015 | Abido | G01R 31/088 702/59 |
| 2015/0301101 | A1 * | 10/2015 | Abido | G01R 31/088 702/59 |
| 2015/0363551 | A1 * | 12/2015 | Cezar | G06F 17/18 506/4 |
| 2016/0116522 | A1 * | 4/2016 | Abido | G01R 31/088 702/59 |
| 2016/0315774 | A1 * | 10/2016 | Faruque | H04L 9/3242 |
| 2016/0378915 | A1 * | 12/2016 | Araya | C12Q 1/6886 702/20 |
| 2017/0133849 | A1 * | 5/2017 | Feng | G05F 1/70 |

* cited by examiner

DATA MINING BASED APPROACH FOR ONLINE CALIBRATION OF PHASOR MEASUREMENT UNIT (PMU)

REFERENCE TO RELATED APPLICATION

This application claims the benefit of the filing date of U.S. Provisional Application Ser. No. 62/429,898, entitled "A data mining based approach for online calibration of Phasor Measurement Unit (PMU)" and filed on Dec. 5, 2016. The teachings of the entire referenced application are incorporated herein by reference.

TECHNICAL FIELD

This invention is related to methods to calibrate phasor measurement unit and its applications. More particularly, this invention presents a novel framework for online error detection and calibration of PMU measurement using density-based spatial clustering of applications with noise (DB-SCAN) based on much relaxed assumptions.

BACKGROUND

A phasor measurement unit (PMU) is a device which measures the 50/60 Hz AC waveform (voltages and currents) on an electricity grid using a common time source Global Positioning System (GPS) radio clock for synchronization. Time synchronization allows synchronized real-time measurements of multiple remote measurement points on the grid. The resulting measurement is known as a synchrophasor. The obtained synchrophasor measurement is of great importance in tremendous modern power system applications, for instance, support demand response mechanism to manage a power system, detect early fault allowing for isolation of operative system and prevent power outages, provide trustful information for power system state estimation, etc. Phasor measurement unit (PMU) is envisioned to be one of the enabling technologies in smart grid, with the promise of massive installation in the future power systems. On one hand, most synchrophasor-based applications, especially the mission critical ones, require the measurements to be very reliable and accurate. On the other hand, although PMU data are expected to be highly accurate, this potential accuracy and reliability are not always achieved in actual field installation due to various causes [1]. It has been observed under many occasions that PMU measurements can have various types of data quality issues. To ensure accurate, reliable and consistent PMU data, there are pressing needs to calibrate PMU to fulfill the claimed performance.

As discussed in [2], the PMU device itself is typically very accurate, but the instrumental channel, where PMU gets its inputs, is usually much less accurate. Specifically, the instrumentation channel (e.g., potential and current transformers) can introduce magnitude and phase angle errors that can be magnitudes of orders higher than the typical PMU accuracy. A practically useful calibration method should be capable of handling inaccuracies originated from both PMU and its instrumentation channel.

Previously the Performance and Standards Task Team (PSTT) published a PMU system testing and calibration guide [3]. As discussed and widely accepted in the 2016 NASPI Work Group meeting, PMU data quality efforts need to be implemented to ensure the highest synchrophasor signal quality for applications. The modified IEEE C37.118 standard requires the total vector error (TVE) between a measured phasor and its true value to be well within 1% under steady-state operating conditions [4]. Towards these requirements, many PMU calibration schemes have been proposed. In general, these methods can be divided into two categories based on how they are implemented: offline testing/calibration [5-11] and model-based approaches [12-16].

The former works by comparing PMU output against standard testing signal(s), using certain types of specialized equipment or systems whose accuracies are at least one level greater than the to-be-tested PMUs. This type of methods requires specialized expensive equipment/system, and due to their offline nature, errors originated from the instrumentation channel cannot be duplicated and compensated.

The latter works by fitting PMU measurements into a mathematical model for fidelity check, assuming parameters of the system/device(s) and the model are known a priori and accurate. In [12], the authors present a phasor-data-based state estimator (PSE) that is capable of identifying and correcting bias error(s) in phase angles. This approach assumes the phasor magnitudes and network parameters are both accurate. One paper in [13] proposes the idea of a "super calibrator" for substation-level data filtering and state estimation, the input of which includes PMU data, SCADA data, and a detailed 3-phase model of the substation, etc. Despite complexity of the model, the accuracy level of SCADA data adds uncertainty, or even degrades performance of the approach. Paper [1] proposes a calibration-factor-based iterative non-linear solution approach for 3-phase PMU data calibration. Performance of the approach is highly dependent upon accuracy of the 3-phase transmission line parameters in the EMS database. The PMU data calibration approach in [14] again assumes the transmission line (TL) impedances are known to be exact. Papers [15] and [16] attempt to accomplish line parameter estimation and PMU calibration simultaneously, with the assumption that one of the two PMUs generates perfect measurements, which, in practice, is really difficult to tell. The strong assumptions used in existing model-based methods undermine their practicability.

This invention presents a novel data mining based synchrophasor measurement calibration framework which detects and corrects the overall systematic or bias error(s) introduced by both PMU and its instrumentation channel. Major contribution of the proposed method lies in that it does not require accurate prior knowledge of the system mathematical model/parameters. Furthermore, one byproduct of the proposed method is more accurate impedance parameters of the transmission line for EMS database and protective relay settings. By relaxing those strong assumptions employed in existing model based approaches, the proposed method advances the practicability of online PMU calibration.

The remainder of this patent application is organized as follows. Section I describes the problem and related mathematical models. Section II presents the proposed framework. Case studies are presented in section III while conclusion and advantages are discussed in section IV.

SUMMARY OF THE INVENTION

This invention presents a novel approach for online calibration of PMU by using density-based spatial clustering. As compared to existing methods, this invention has two major advantages: 1) it identifies the overall bias errors introduced by both PMU and its instrumentation channel; 2) it does not require accurate system model/parameters.

Therefore, it is applicable across a wide spectrum of practical conditions. In addition, one by-product of the proposed approach is more accurate transmission line (TL) impedance estimation for improved system modeling, more accurate protective relay settings, and other related applications.

BRIEF DESCRIPTIONS OF FIGURES

Figure 2:
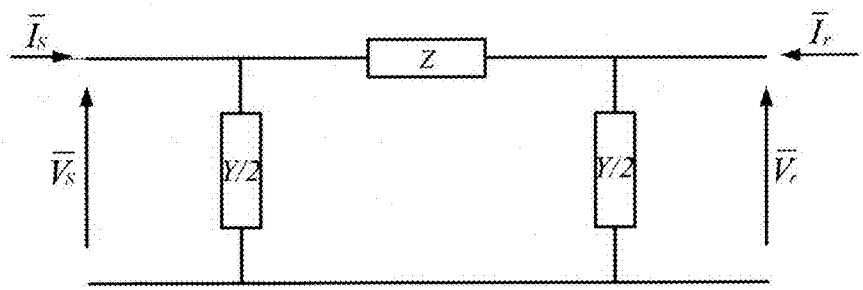
Figure 3:
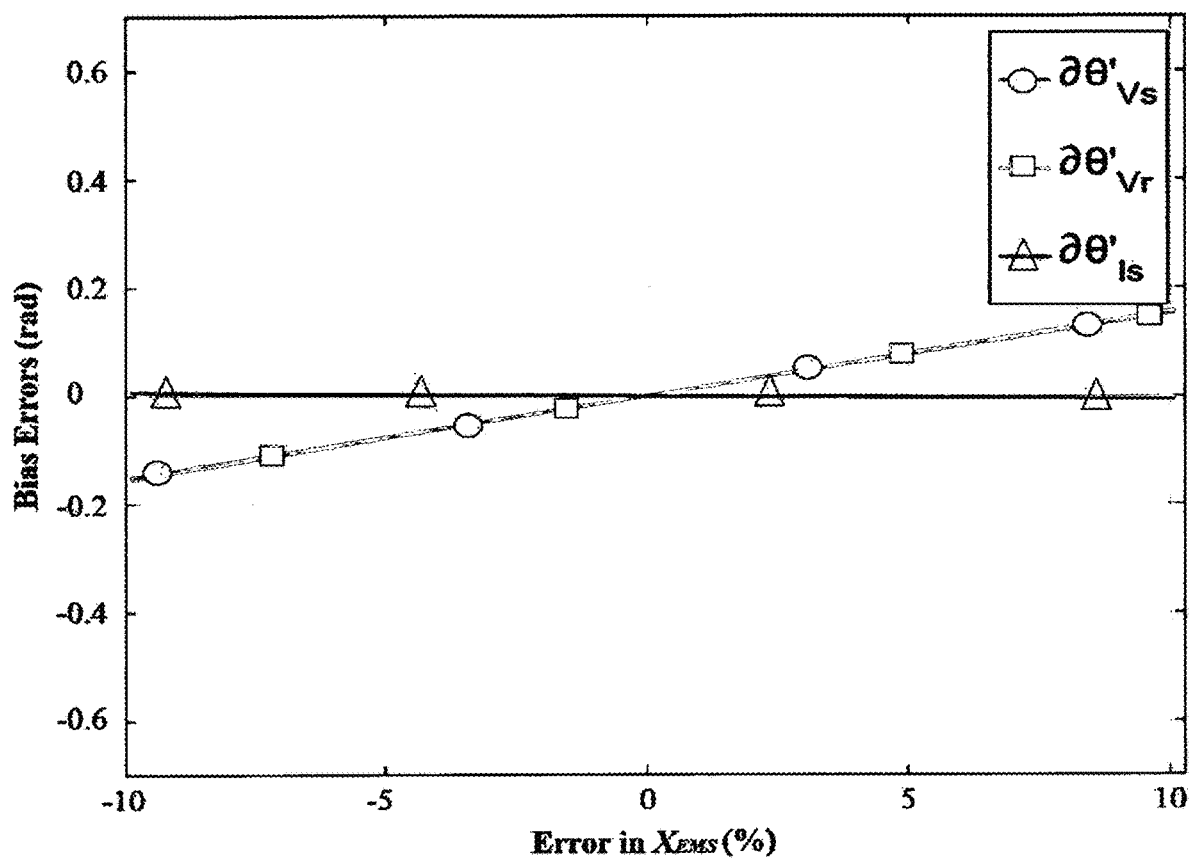
Figure 4:
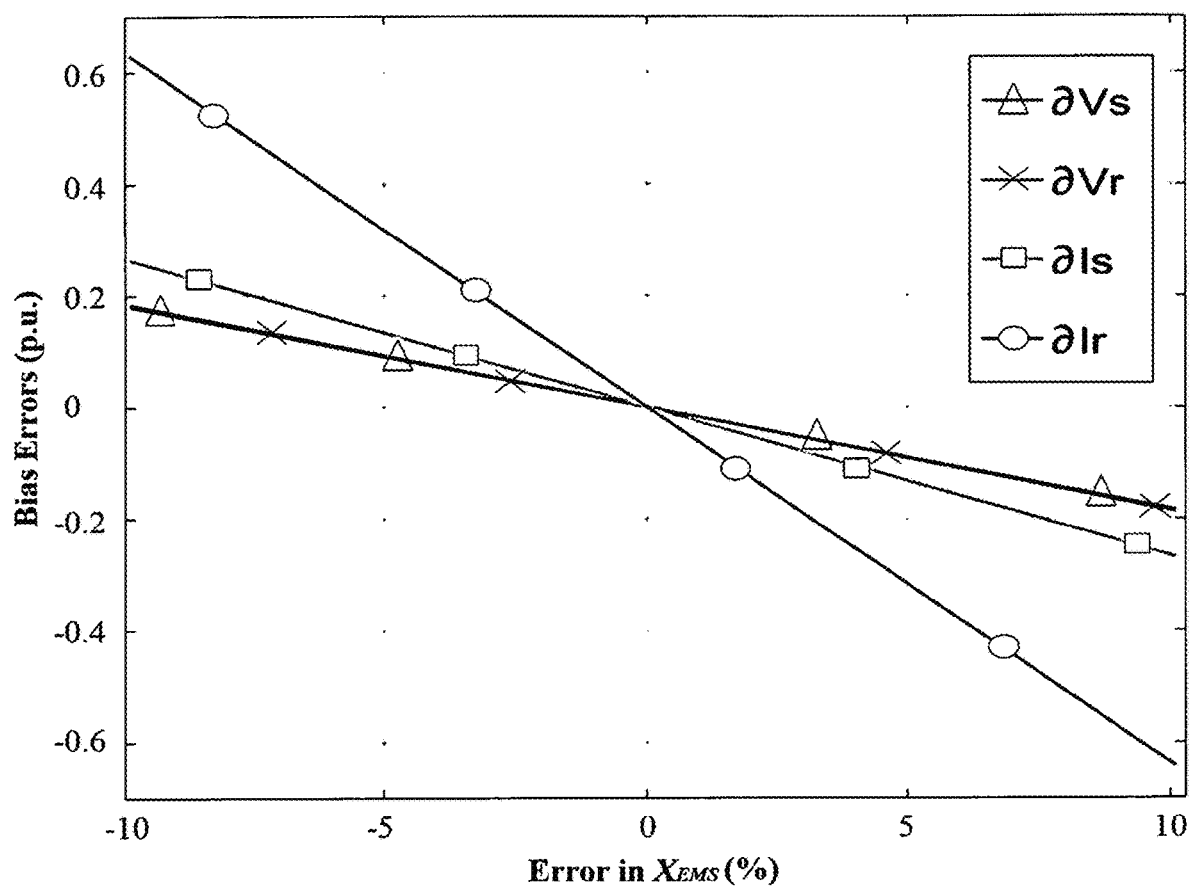
Figure 5:
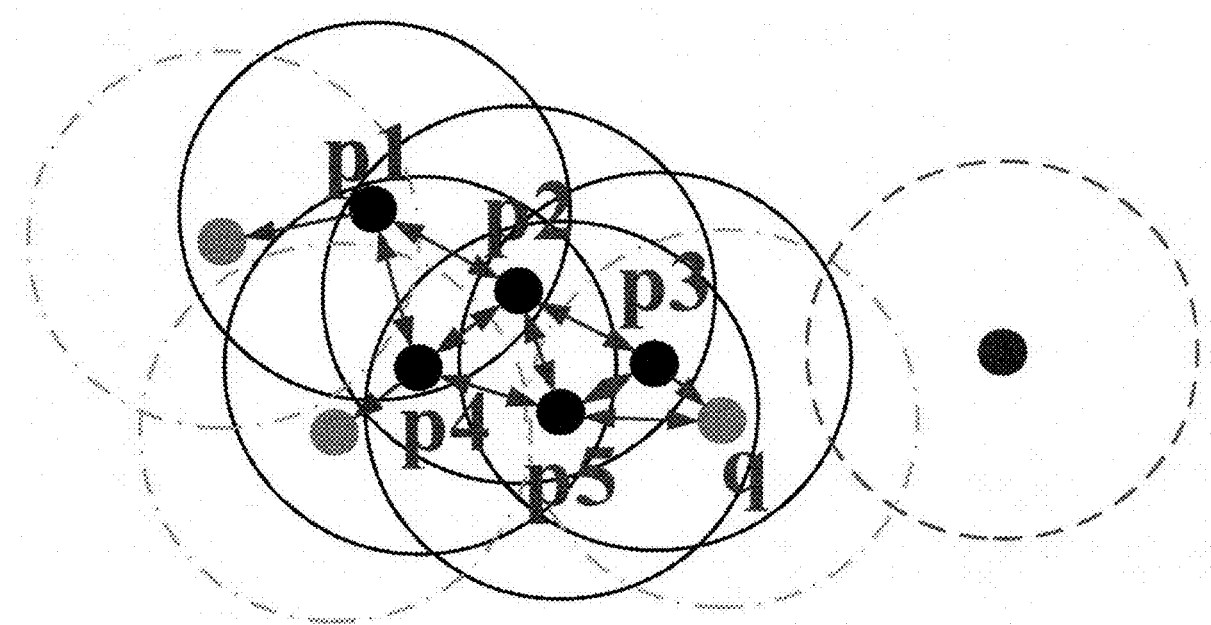
Figure 6:
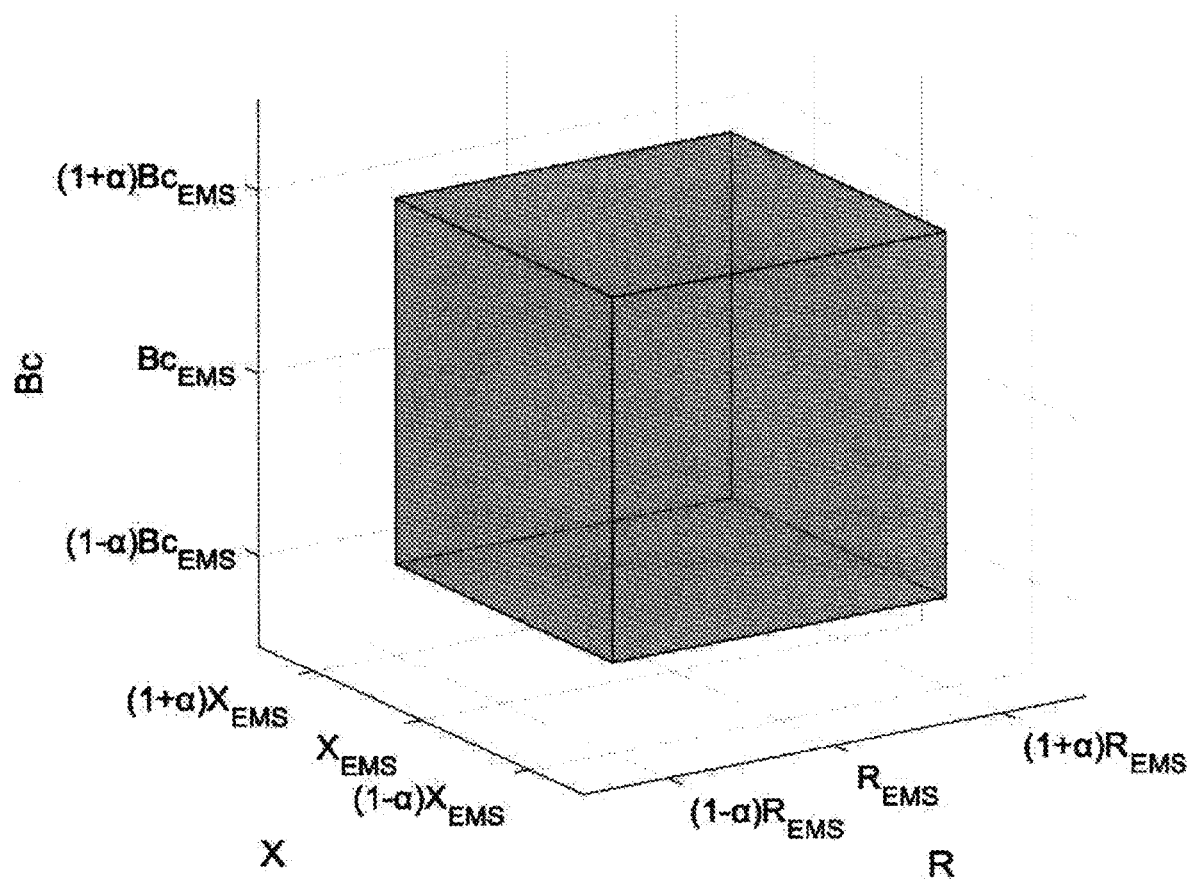
Figure 7:
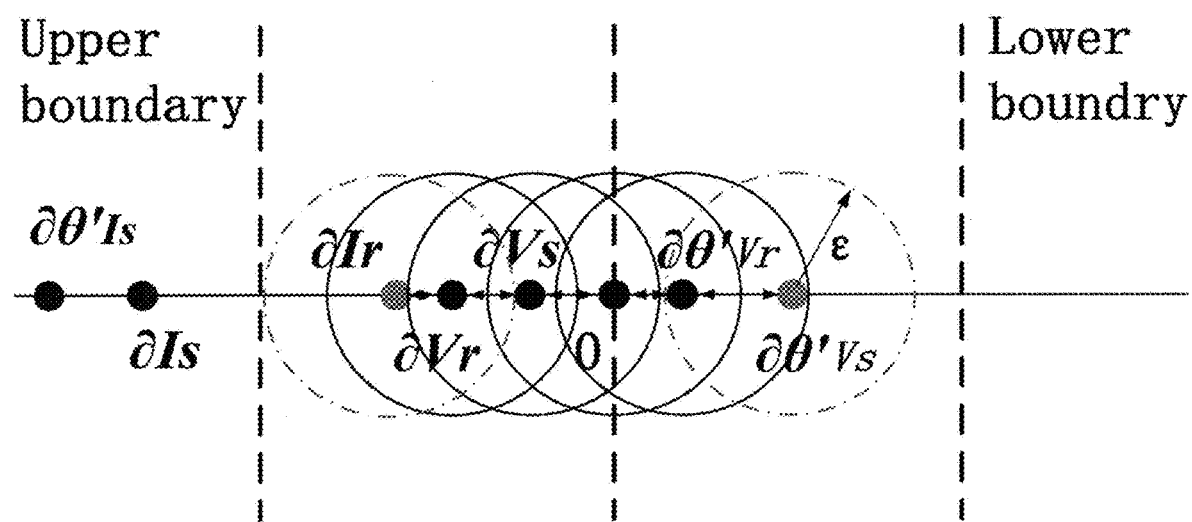
Figure 8:
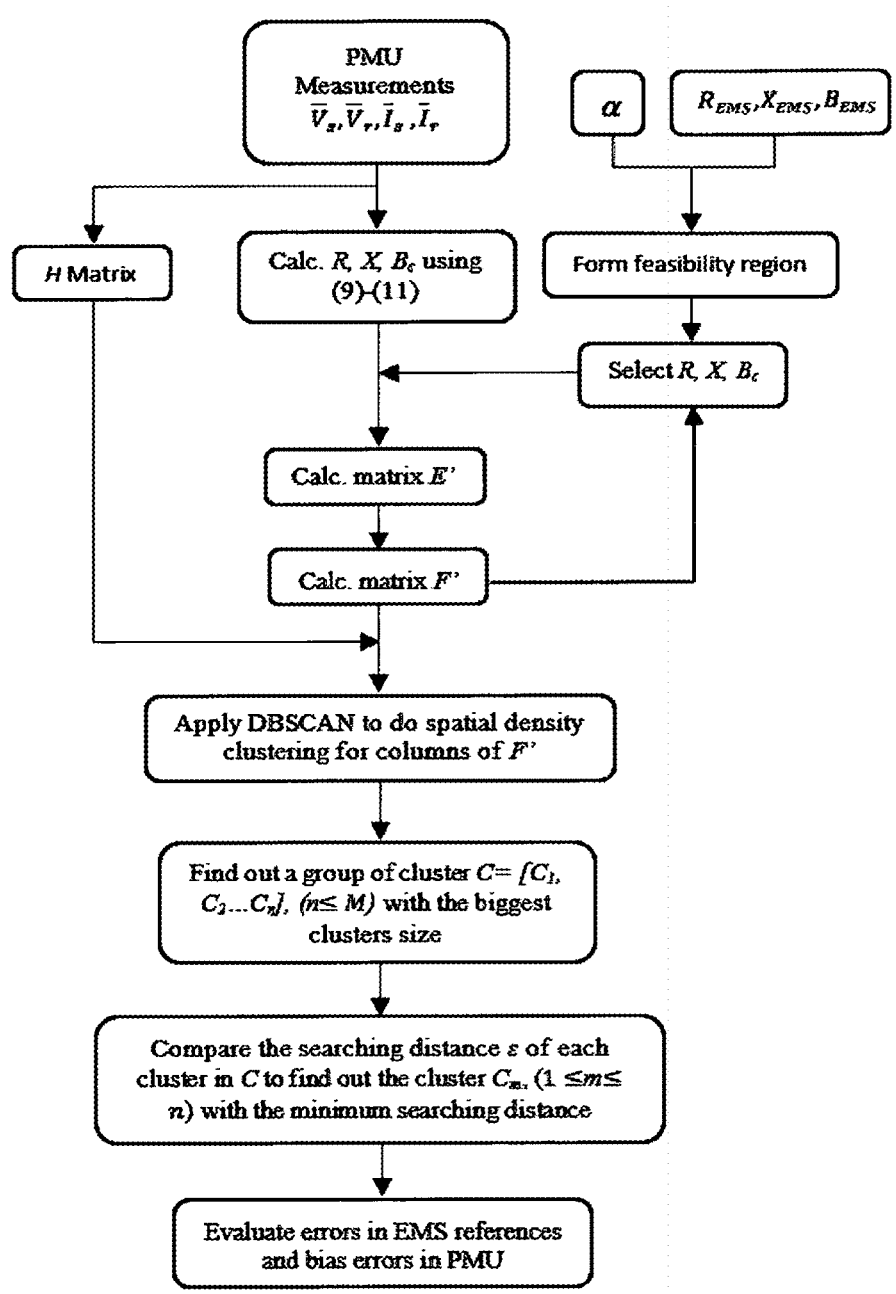
Figure 9:
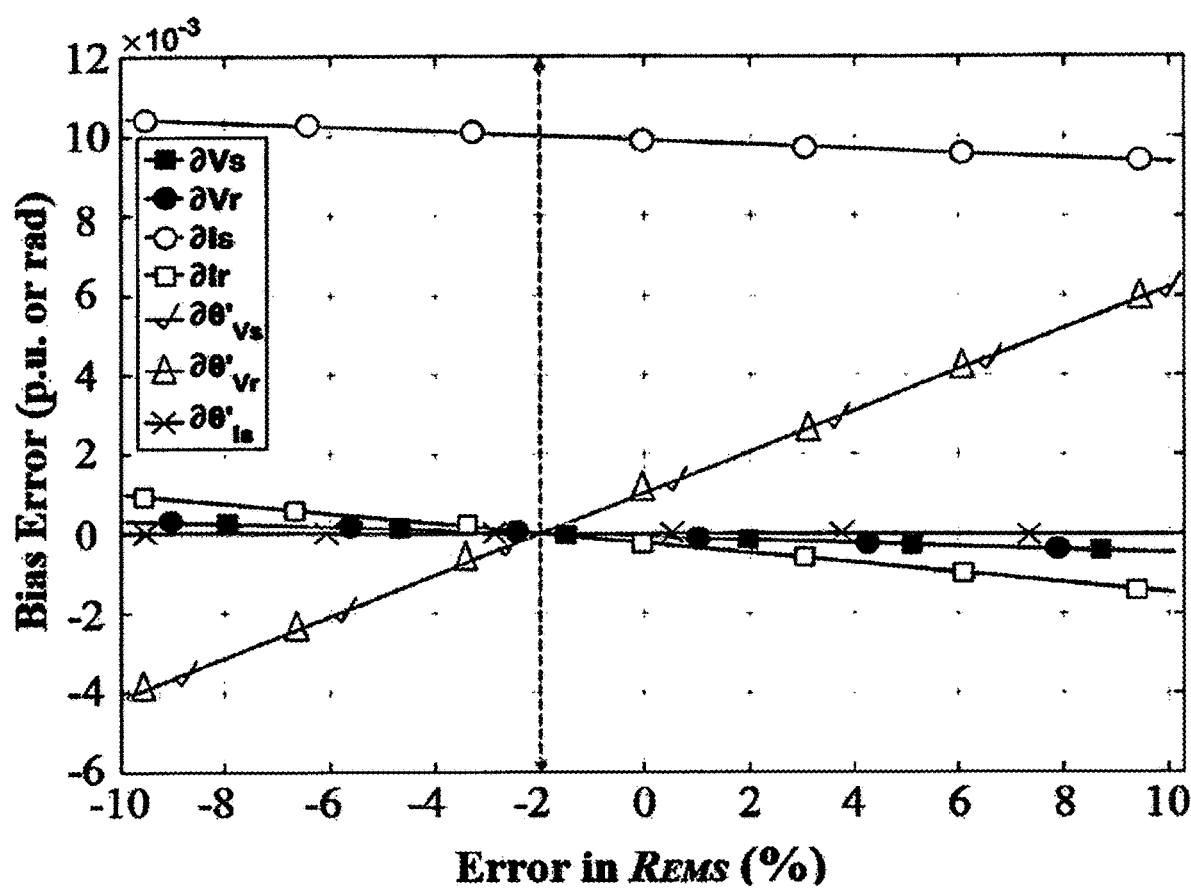
Figure 10:
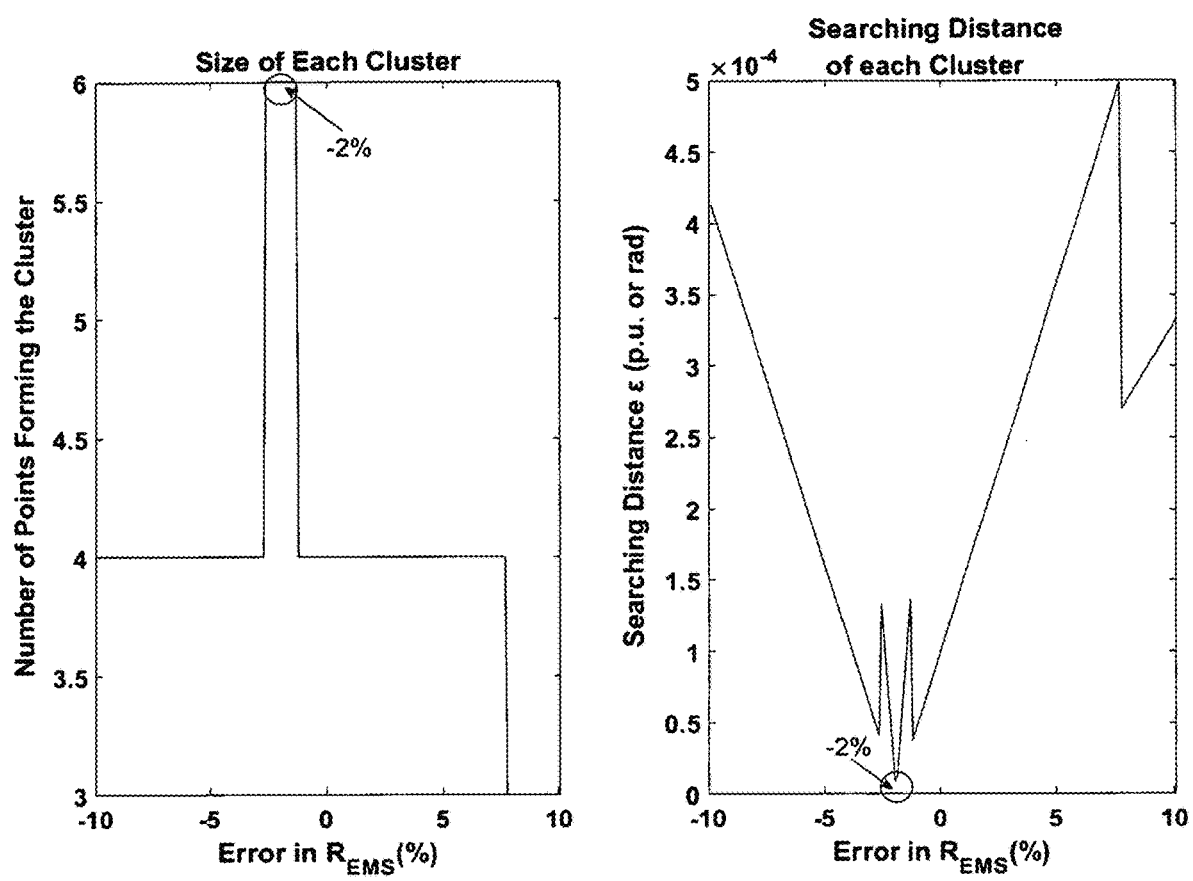
Figure 11:
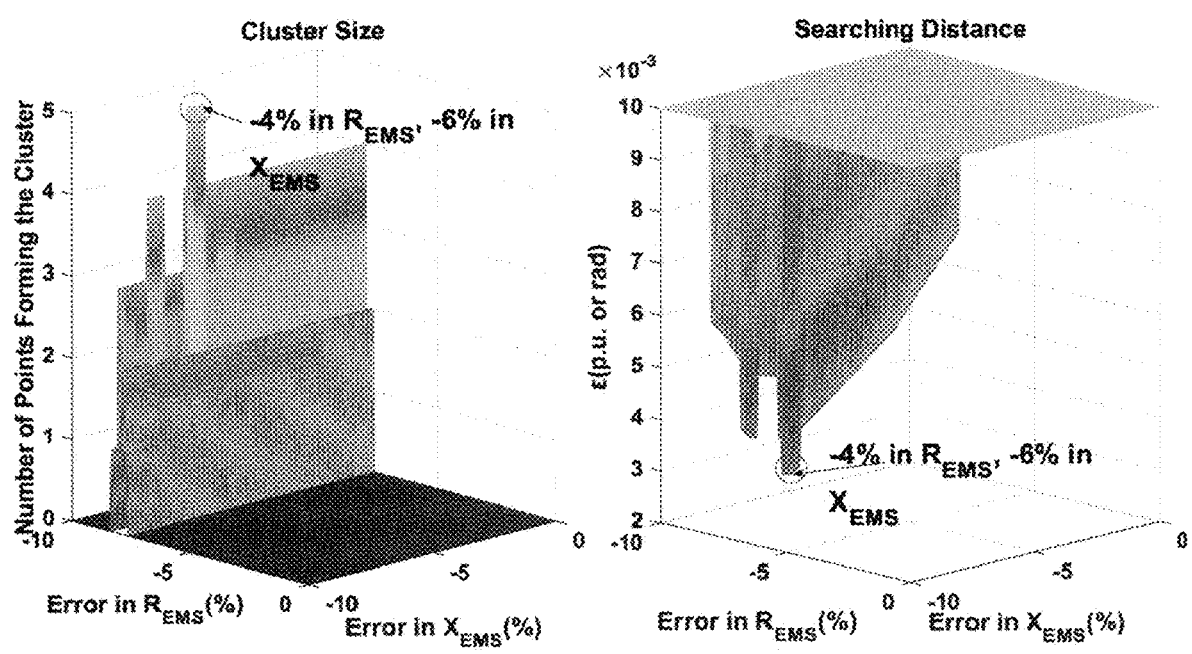
Figure 12:
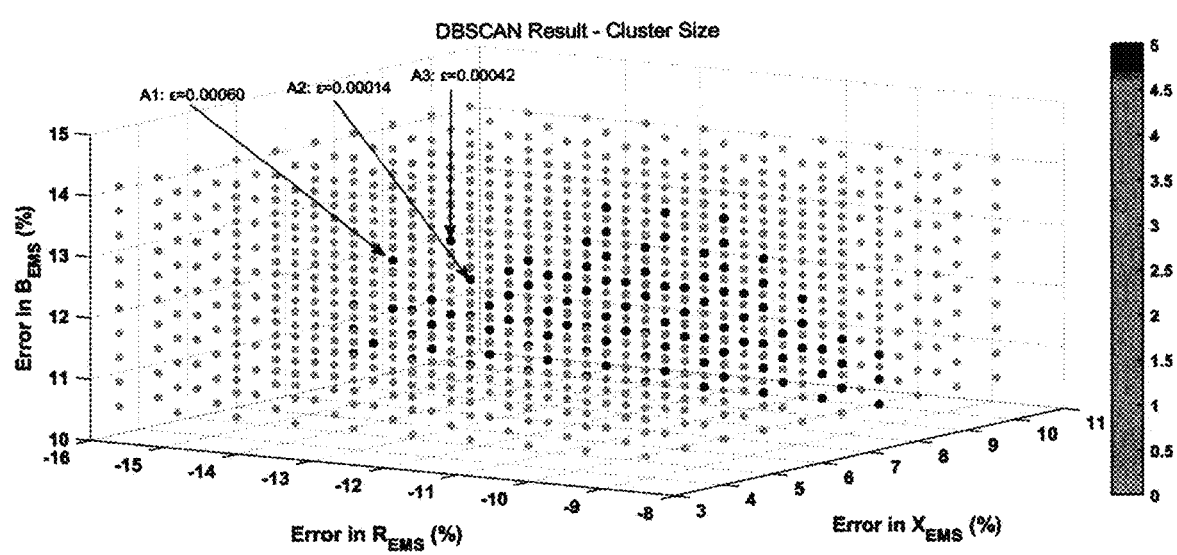

FIG. 1 Bias error in PMU measurement.
FIG. 2 Transmission line nominal/equivalent PI model.
FIG. 3 Sensitivity analysis-estimated bias error in phase angle vs. line reactance.
FIG. 4 Sensitivity analysis-estimated bias error in magnitude vs. line reactance.
FIG. 5 Schematic diagram of DBSCAN with minPts=4.
FIG. 6 Feasible region for transmission line (TL) impedances.
FIG. 7 An example of bias error identification using DBSCAN.
FIG. 8 Flow chart of proposed PMU data calibration approach.
FIG. 9 Relationships between identified bias errors and error in $R_{EMS}$.
FIG. 10 Results of DBSCAN for Case II.
FIG. 11 DBSCAN Clustering Results for Case III.
FIG. 12 Experiment result with real PMU data (errors in R, X, and Bc vs. cluster size).

DETAILED DESCRIPTION OF THE ILLUSTRATED EMBODIMENTS

I. Problem Description and Formulation

A. Bias Error in PMU Measurements

Generally speaking, errors in synchrophasor measurements can originate from three possible sources as discussed in [17]: transducers, synchronization, and phasor estimation algorithm. Impacts of these three sources can be summarized into two categories: random error and bias (systematic) error.

Random error, as its name suggests, is random in either direction in its nature and difficult to predict. Random error can be circumvented from measurements via statistical means. Extensive studies have been conducted in reducing random error or its influences to PMU measurements, with satisfactory results observed: unbiased linear least squares (LS) is used in [18]; non-linear LS algorithms are used in [19, 20]; total LS is introduced in [21]; other optimization procedures are discussed in [22, 23].

Systematic or bias error is reproducible inaccuracy that is consistent in the same direction. Bias error is much harder to estimate and remove. Authors of [2] have examined the maximum bias errors introduced by different portions of the measurement chain. Table I summarizes the maximum bias error for a typical 230-kV system. For example, with a 400-ft instrumentation cable, the maximum bias errors in the magnitude and phase angle of the voltage phasor are 0.709% and 1.471 degree, respectively. These bias errors are no longer negligible and a systematic approach needs to be developed to identify and remove them, which is the scope of this invention.

B. Notations and Models

FIG. 1 shows a measured voltage phasor $\bar{V}$, its corresponding true phasor value $\bar{V}_{true}$, and the associated bias errors in magnitude $\partial V$ and phase angle $\partial \theta$. The following relationship is derived:

$$\bar{V} = V \cdot e^{j\theta_V} \quad (1)$$

$$\bar{V}_{true} = (V + \partial V) \cdot e^{j(\theta_V + \partial \theta)} \quad (2)$$

where V and $\theta_V$ are the magnitude and phase angle of phasor $\bar{V}$, respectively.

A PI model as shown in FIG. 2 is considered in this work as the model for a general transmission line. It could either be a nominal PI model if the line is short or an equivalent PI if the line is longer [24]. In FIG. 2, $\bar{V}_s$ and $\bar{I}_s$ represent the positive sequence voltage and current phasors measured at sending end of the line while $\bar{V}_r$ and $\bar{I}_r$ are the corresponding phasors collected from receiving end. Variables Z and Y represent series impedance and shunt admittance of the PI model.

The following equations are derived from nodal analysis:

$$\bar{I}_s - \bar{V}_s \cdot \frac{Y}{2} + \bar{I}_r - \bar{V}_r \cdot \frac{Y}{2} = 0 \quad (3)$$

$$\bar{V}_s - Z \cdot \left(\bar{I}_s - \bar{V}_s \cdot \frac{Y}{2}\right) - \bar{V}_r = 0 \quad (4)$$

and $$Z = R + jX \quad (5)$$

$$Y = G + jB_c \quad (6)$$

where G and $B_c$ are line shunt conductance and susceptance.

TABLE I

MAXIMUM BIAS ERRORS INTRODUCED BY DIFFERENT PORTIONS OF THE PMU MEASUREMENT CHAIN IN A 230-KV SYSTEM [2]

| Source of Error | Voltage Phasor | | Current Phasor | |
|---|---|---|---|---|
| | Magnitude (%) | Phasor Angle (degree) | Magnitude (%) | Phasor Angle (degree) |
| PT/CT | 0.6 | 1.04 | 1.2 | 0.52 |
| Cabling | 100 ft  400 ft | 100 ft  400 ft | 100 ft  400 ft | 100 ft  400 ft |
| | 0.009  0.009 | 0.115  0.411 | 0.066  0.066 | 0.03   0.09 |
| PMU | 0.1 | 0.02 | 0.1 | 0.02 |
| Total | 0.709  0.709 | 1.175  1.471 | 1.366  1.366 | 0.57   0.63 |

Combing equations (3)-(4) to solve for Y and Z yields:

$$Z = \frac{\overline{V}_s^2 - \overline{V}_r^2}{\overline{I}_s \cdot \overline{V}_r - \overline{I}_r \cdot \overline{V}_s} \quad (7)$$

$$Y = 2 \cdot \frac{\overline{I}_s + \overline{I}_r}{\overline{V}_s + \overline{V}_r} \quad (8)$$

Substituting each phasor in (7)-(8) with its magnitude and phase angle according to (1) and setting phase angle of $I_r$, $\theta_{I_r}$, as the reference, the following equations can be derived:

$$R = \text{real}\left(\frac{V_s^2 e^{i2\theta'_{V_s}} - V_r^2 e^{i2\theta'_{V_r}}}{I_s \cdot V_r e^{i(\theta'_{I_s}+\theta'_{V_r})} - I_r \cdot V_s e^{i\theta'_{V_s}}}\right) \quad (9)$$

$$X = \text{imag}\left(\frac{V_s^2 e^{i2\theta'_{V_s}} - V_r^2 e^{i2\theta'_{V_r}}}{I_s \cdot V_r e^{i(\theta'_{I_s}+\theta'_{V_r})} - I_r \cdot V_s e^{i\theta'_{V_s}}}\right) \quad (10)$$

$$B_c = \text{imag}\left(2 \cdot \frac{I_s e^{i\theta'_{I_s}} + I_r}{V_s e^{i\theta'_{V_s}} + V_r e^{i\theta'_{V_r}}}\right) \quad (11)$$

where $\theta'_{V_s} = \theta_{V_s} - \theta_{I_r}$, $\theta'_{V_r} = \theta_{V_r} - \theta_{I_r}$, and $\theta'_{I_s} = \theta_{I_s} - \theta_{I_r}$.

Shunt conductance of a transmission line, G, is usually very small and therefore neglected from the PI model.

C. Least Square Estimator (LSE)

To investigate the sensitivity of line parameters to bias errors in PMU measurements, partial derivatives need to be taken for (9)-(11), all of which are complex equations. For the derivatives to be valid, they must obey the Cauchy-Riemann equations [25]. The compliance checking/procedure is not discussed here due to space consideration, but the validation has been completed. The following equations have been derived:

$$\partial R = A_R \cdot \partial V_s + B_R \cdot \partial V_r + C_R \cdot \partial I_s + D_R \cdot \partial I_r + E_R \cdot \partial \theta'_{V_s} + F_R \cdot \partial \theta'_{V_r} + G_R \cdot \partial \theta'_{I_s} \quad (12)$$

$$\partial X = A_X \cdot \partial V_s + B_X \cdot \partial V_r + C_X \cdot \partial I_s + D_X \cdot \partial I_r + E_X \cdot \partial \theta'_{V_s} + F_X \cdot \partial \theta'_{V_r} + G_X \cdot \partial \theta'_{I_s} \quad (13)$$

$$\partial B_C = A_B \cdot \partial V_s + B_B \cdot \partial V_r + C_B \cdot \partial I_s + D_B \cdot \partial I_r + E_B \cdot \partial \theta'_{V_s} + F_X \cdot \partial \theta'_{V_r} + G_X \cdot \partial \theta'_{I_s} \quad (14)$$

where coefficients $A_x \sim G_x$ are all partial derivatives. Taking R as an example, these coefficients are:

$$A_R = \frac{\partial R}{\partial V_s}, B_R = \frac{\partial R}{\partial V_r}, C_R = \frac{\partial R}{\partial I_s}, D_R = \frac{\partial R}{\partial I_r}, E_R = \frac{\partial R}{\partial \theta'_{V_s}},$$

$$F_R = \frac{\partial R}{\partial \theta'_{V_r}}, \text{ and } G_R = \frac{\partial R}{\partial \theta'_{I_s}}.$$

For space consideration, detailed information of these partial derivatives is discussed in Appendix I. Put equations (12)-(14) into matrix form to obtain:

$$\begin{bmatrix} \partial R \\ \partial X \\ \partial B_c \end{bmatrix} = \begin{bmatrix} A_R & B_R & C_R & D_R & E_R & F_R & G_R \\ A_X & B_X & C_X & D_X & E_X & F_X & G_X \\ A_B & B_B & C_B & D_B & E_B & F_B & G_B \end{bmatrix} \cdot \begin{bmatrix} \partial V_s \\ \partial V_r \\ \partial I_s \\ \partial I_r \\ \partial \theta'_{V_s} \\ \partial \theta'_{V_r} \\ \partial \theta'_{I_s} \end{bmatrix} \quad (15)$$

It should be noted that coefficients $A_x \sim G_x$ vary with the loading (current), as can be seen from the expression of, for example, $$C_R + iC_X = \frac{\partial Z}{\partial I_s} = \frac{V_r e^{i(\theta'_{V_r}+\theta'_{I_s})} \cdot (V_r^2 e^{i2\theta'_{V_r}} - V_s^2 e^{i2\theta'_{V_s}})}{(I_r V_s e^{i\theta'_{V_s}} - I_s V_r e^{i(\theta'_{V_r}+\theta'_{I_s})})^2}.$$

Assuming N sets of PMU measurements under different load conditions are collected, the following matrix can be written:

$$H = \begin{bmatrix} A_{R1} & B_{R1} & C_{R1} & D_{R1} & E_{R1} & F_{R1} & G_{R1} \\ A_{X1} & B_{X1} & C_{X1} & D_{X1} & E_{X1} & F_{X1} & G_{X1} \\ A_{B1} & B_{B1} & C_{B1} & D_{B1} & E_{B1} & F_{B1} & G_{B1} \\ A_{R2} & B_{R2} & C_{R2} & D_{R2} & E_{R2} & F_{R2} & G_{R2} \\ A_{X2} & B_{X2} & C_{X2} & D_{X2} & E_{X2} & F_{X2} & G_{X2} \\ A_{B2} & B_{B2} & C_{B2} & D_{B2} & E_{B2} & F_{B2} & G_{B2} \\ \vdots & \vdots & \vdots & \vdots & \vdots & \vdots & \vdots \\ A_{RN} & B_{RN} & C_{RN} & D_{RN} & E_{RN} & F_{RN} & G_{RN} \\ A_{XN} & B_{XN} & C_{XN} & D_{XN} & E_{XN} & F_{XN} & G_{XN} \\ A_{BN} & B_{BN} & C_{BN} & D_{BN} & E_{BN} & F_{BN} & G_{BN} \end{bmatrix} \quad (16)$$

$$F = \begin{bmatrix} \partial V_s \\ \partial V_r \\ \partial I_s \\ \partial I_r \\ \partial \theta'_{V_s} \\ \partial \theta'_{V_r} \\ \partial \theta'_{I_s} \end{bmatrix}, E = \begin{bmatrix} \partial R_1 \\ \partial X_1 \\ \partial B_{c1} \\ \partial R_2 \\ \partial X_2 \\ \partial B_{c2} \\ \vdots \\ \partial R_n \\ \partial X_n \\ \partial B_{cn} \end{bmatrix} \quad (17)\text{-}(18)$$

If an accurate set of line impedance parameters is known a priori, the bias errors in the PMU measurements can be easily estimated using the standard least square estimator, as:

$$F = (H^T H)^{-1} H^T E \quad (19)$$

Seven unknowns appear in F and therefore the rank of H matrix has to be no less than seven which requires $3 \times N \geq 7$ or $N \geq 3$, ($N \in N^*$). Vector E is comprised of the difference between the true line impedance values and the calculated ones using (9)-(11). With the assumption that accurate line impedances are known, here are the steps for evaluating the bias errors in PMU measurements:

Step 1: calculate line impedance parameters R, X, and B according to (9)-(11);

Step 2: evaluate vector E by comparing the calculated line impedances (from step 1) to their corresponding references obtained from the EMS database: $R_{EMS}$, $X_{EMS}$, and $B_{EMS}$;

Step 3: evaluate matrix H with the partial derivatives calculated from PMU measurements: $\bar{V}_s$, $\bar{V}_r$, $\bar{I}_s$, and $\bar{I}_r$;

Step 4: solve for vector F based on (19).

D. The Challenge

The aforementioned least square estimator is able to identify bias errors in PMU measurements assuming the line's actual impedances, as the references, are known a priori. In practice, these parameters are read off from EMS database and were originally calculated based on tower geometries, conductor dimensions, estimates of line length, and conductor sags, etc. They only approximate the effects of conductor sags and ignore the dependence of impedance parameters on temperature and loading conditions [26, 27]. Therefore, the challenge is that only approximates of line impedances are known and without knowing their true values the calculated bias errors might be far from being accurate. In the following section, this invention shows how this challenge can be addressed by using data mining technology like Density-based Spatial Clustering.

II. Proposed Solution

A. Sensitivity Analysis

This subsection conducts sensitivity analysis and investigates influence of errors in referenced line impedances on bias error estimation in PMU measurements. A simulated transmission line with specifications shown in Appendix II is used for this study. Errors are added to all three line impedance references, one at a time, and the least square estimator described in section I. C. is employed to evaluate F. As an example, results of the sensitivity analysis for line reactance X are shown in FIG. 3-FIG. 4.

From FIG. 3-FIG. 4, it can be observed that the influence of error in $X_{EMS}$ on bias error estimation is linear. A 10% error in $X_{EMS}$ will result in: 0.16 rad error in $\partial\theta'_{V_s}$ and $\partial\theta'_{V_r}$; 0.01 rad error in $\partial\theta'_{I_s}$; 0.66 pu error in $\partial I_r$; 0.28 pu error in $\partial I_s$; 0.20 pu error in both $\partial V_s$ and $\partial V_r$. Bias error estimation in $\theta'_{I_s}$ is not really affected by error in $X_{EMS}$ while its corresponding magnitude is affected the most among all bias errors. Results of the sensitivity analysis are summarized in Table II.

TABLE II

RESULTS FOR SENSITIVITY ANALYSIS

| | Error (%) | $\partial V_s$ | $\partial V_r$ | $\partial I_s$ | $\partial I_r$ | $\partial\theta'_{V_s}$ | $\partial\theta'_{V_r}$ | $\partial\theta'_{I_s}$ |
|---|---|---|---|---|---|---|---|---|
| | | | | p.u. | | | rad | |
| $\partial R$ | -10 | 0.051 | 0.051 | 0.072 | 0.152 | 0.005 | 0.005 | 0.001 |
| | -5 | 0.025 | 0.025 | 0.036 | 0.075 | 0.003 | 0.003 | 0.000 |
| | 0 | 0.000 | 0.000 | 0.000 | 0.000 | 0.000 | 0.000 | 0.000 |
| $\partial X$ | -10 | 0.200 | 0.200 | 0.283 | 0.658 | 0.163 | 0.162 | 0.010 |
| | -5 | 0.101 | 0.101 | 0.142 | 0.329 | 0.082 | 0.081 | 0.005 |
| | 0 | 0.000 | 0.000 | 0.000 | 0.000 | 0.000 | 0.000 | 0.000 |
| $\partial BC$ | -10 | 0.061 | 0.061 | 0.162 | 0.360 | 0.090 | 0.080 | 0.010 |
| | -5 | 0.030 | 0.030 | 0.081 | 0.181 | 0.045 | 0.040 | 0.005 |
| | 0 | 0.000 | 0.000 | 0.000 | 0.000 | 0.000 | 0.000 | 0.000 |

A few observations can be made based on Table II, 1) PMU measurement bias error(s) estimation is generally sensitive to error(s) in line impedance references; 2) impact of reference errors to bias error estimation is linear; 3) if line impedance references are exactly known a priori, all bias error can be accurately estimated.

However, in practice, line impedance references cannot be known exactly, as discussed in section I. D. To address this challenge, a data mining approach based on DBSCAN is proposed to address the uncertainties in transmission line (TL) impedance references.

B. DBSCAN Basics

Density-based spatial clustering of applications with noise (DBSCAN) is an unsupervised data mining technique which is able to classify data points of any dimension into core points, reachable points and outliers [28]. A core point p contains at least minPts points (including p) within the designated searching distance ε. A reachable point q exists if there exists a path p1, p2, . . . , q, so that all points on the path, except q, are core points. Points that are not reachable from any other point are outliers. Core points and reachable points can form a cluster while outliers are excluded from such cluster. FIG. 5 shows an example for DBSCAN with minPts=4. Note that setting minPts to 3 will generate the same clustering result.

As shown in FIG. 5, core points are in red, each of which has at least 4 points with distance less than ε. The yellow ones (reachable points) are reachable from the red ones but do not have the required minimum number of points nearby within the distance of ε. The blue one is not reachable from any other point and therefore is an outlier. The red and yellow points form a cluster with the blue one excluded.

C. PMU Calibration Using DBSCAN

Although EMS references can be significantly wrong, our experience shows that the error bands are generally well within 20%. Therefore, we may define a as the error band multiplier for impedance references obtained from the EMS database ($R_{EMS}$, $X_{EMS}$, and $B_{EMS}$). The following constraints can be considered:

$$\begin{cases} (1-\alpha)R_{EMS} \leq R \leq (1+\alpha)R_{EMS} \\ (1-\alpha)X_{EMS} \leq X \leq (1+\alpha)X_{EMS} \\ (1-\alpha)B_{EMS} \leq B_c \leq (1+\alpha)B_{EMS} \end{cases} \quad (20)$$

The corresponding feasibility region can be visualized as the cube shown in FIG. 6.

The basic idea of the invented approach is to 1) scan every point within feasible region (a total of M points); 2) evaluate the corresponding bias errors in the PMU measurements; 3) form sets of points with each set containing seven 4-dimensional data points, and each data point has the form of ($\partial R$, $\partial X$, $\partial B_c$, x), where x is one of the bias errors in PMU measurements (a total of M sets). 4) apply DBSCAN to cluster all the M data sets to find out the one with least number of outliers (maximum number of core and reachable points) and minimum searching distance. Once this cluster is identified, the actual bias errors in all PMU channels and errors in line impedance references can be determined accordingly.

To minimize the computation, equation (19) is extended to (21). As compared to vector E and F in (19), matrix E'(3N-by-M) and F'(7-by-M) are the extended version which relates multiple bias error sets to multiple sets of the error in referenced impedances. FIG. 7 shows a simple illustrative example of the DBSCAN algorithm for bias error identification.

$$\begin{bmatrix} \partial V_s^1 & \partial V_s^2 & & \partial V_s^M \\ \partial V_r^1 & \partial V_r^2 & & \partial V_r^M \\ \partial I_s^1 & \partial I_s^2 & \ldots & \partial I_s^M \\ \partial I_r^1 & \partial I_r^2 & \ldots & \partial I_r^M \\ \partial \theta V_s'^1 & \partial \theta V_s'^2 & \ldots & \partial \theta V_s'^M \\ \partial \theta V_r'^1 & \partial \theta V_r'^2 & & \partial \theta V_r'^M \\ \partial \theta I_s'^1 & \partial \theta I_s'^2 & & \partial \theta I_s'^M \end{bmatrix} = (H^T H)^{-1} H^T \begin{bmatrix} \partial R_1^1 & \partial R_1^2 & & \partial R_1^M \\ \partial X_1^1 & \partial X_1^2 & & \partial X_1^M \\ \partial B_{c1}^1 & \partial B_{c1}^2 & & \partial B_{c1}^M \\ \partial R_2^1 & \partial R_2^2 & & \partial R_2^M \\ \partial X_2^1 & \partial X_2^2 & \ldots & \partial X_2^M \\ \partial B_{c2}^1 & \partial B_{c2}^2 & \ldots & \partial B_{c2}^M \\ \vdots & \vdots & \ldots & \vdots \\ \vdots & \vdots & & \vdots \\ \vdots & \vdots & & \vdots \\ \partial R_N^1 & \partial R_N^2 & & \partial R_N^M \\ \partial X_N^1 & \partial X_N^2 & & \partial X_N^M \\ \partial B_{cN}^1 & \partial B_{cN}^2 & & \partial B_{cN}^M \end{bmatrix}$$

(21)

Or $$F' = (H^T H)^{-1} H^T E'$$

FIG. 7 shows an exemplary DBSCAN result for one data set (one column in F'). Point zero is pre-defined as one of the core point and the cluster search always starts from zero. According to IEEE standard [4], the searching distance E can be initially set to 0.03% for phasor magnitude and 0.01° for phasor angle. The minimum number requirement minPts is set to be 3. In this particular example, the clustering results indicates that a total of 6 points are either core or reachable points while 2 points are outliers (the ones with $\partial I_s$ and $\partial \theta'_{I_s}$).

The pseudo-code for the proposed DBSCAN based PMU calibration is presented below.

surements, by using DBSCAN, all the seven curves in the 4-dimensional space ($\partial R$, $\partial X$, $\partial Bc$, x), where x is one of the bias errors in PMU measurements, intersect at a single point (0, 0, 0, 0). When there are errors either in the EMS references or in the PMU measurements, according to the proposed approach, coordinates of this intersection corresponds to the error(s) in the EMS reference, while the outlier(s) identified correspondingly are the bias errors in PMU measurements.

The aforementioned discussion is for the situation without noise. When noise exists in PMU measurements, the seven curves typically will not intercept exactly at a single point but instead will stay very close to each other around one particular zone/region, which may be referred to as the "zero region". By looking at the searching distance and number of outliers, the "zero region" can be identified and therefore the errors in EMS references and PMU measurements can be evaluated accordingly.

III. Experimental Validation

Five case studies are presented in this invention to demonstrate the procedure and effectiveness of the proposed PMU data calibration framework. A testing system with parameters shown in Table VIII has been set up in Matlab/Simulink for these experiments.

A. Case I: The Ideal Case-No Error in Impedance References

Objective of the first case study is to validate performance of the proposed method when no error exists in the TL impedance references. Basically, different sets of combinations of bias errors have been added to the PMU measurements and the proposed approach is used to identify them.

```
algorithm DBSCAN_based_PMU_calibration is
    input: PMU phasor measurements,
        Nodes (R, X, B_c) in the cube.
    output: PMU bias errors
        matrix(H) ←PMU measurements
        matrix(E') ←Matrix(Nodes(R, X, B_c) - EMS(R, X, B_c))
    //(LSE: Least Square Estimator)
        matrix(F') ←LSE(H, E')
    vector(CCP)← //CCP: count cluster point
    minPts← 3
        for each column in matrix(F') do
        // i← row index for matrix (F'), (1≤i≤7)
        // j← column index for matrix (F')
            residual(i, j)← |F' (i, j)| (1≤i≤ 7)
            if residual(i,j) is within the boundary α
                C(i, j) ← F'(i, j)
                CCP(j)++
        Endforeach
        for each column in matrix(C) do
        // i← row index for matrix (F'), (1≤i≤ 7)
    // j← column index for matrix (C)
            distance(i, i ± 1)← |C(i, j) − C(i ± 1, j)|. //find the distance from each cluster
point to its neighbor cluster point
            eps(j)= (maximum(|distance|),minPts) // eps(j) is the cluster searching
distance for j^{th} column
        Endforeach
        k← column in F' with maximum CPP and minimum eps
        output
```

A flowchart of the proposed data mining based PMU data calibration approach is shown in FIG. 8. As shown in the sensitivity analysis of section II, impacts of EMS reference errors to the calculation of bias error in each PMU measurement are given. In the ideal case when there is no error in the EMS reference and no bias error in the PMU mea- The results for six representative cases are summarized in Table III, in which both the true bias errors and the calculated ones are presented and compared. The agreement between true bias errors and calculated ones validates the proposed approach under the ideal condition with no error in the referenced impedances.

TABLE III

BIAS ERROR IDENTIFICATION UNDER THE IDEAL CONDITION

|  | True | Calculated | True | Calculated | True | Calculated |
|---|---|---|---|---|---|---|
|  |  | p.u. or rad ($\times 10^{-3}$) |  |  |  |  |
| $\partial V_s$ | 0 | 0.0334 | 10 | 9.9634 | 10 | 10.0395 |
| $\partial V_r$ | 0 | 0.0335 | 10 | 9.9613 | 10 | 10.0402 |
| $\partial I_s$ | 10 | 10.0591 | 0 | −0.2240 | 10 | 10.0177 |
| $\partial I_r$ | 0 | 0.1480 | 0 | −0.5332 | 0 | −0.2318 |
| $\partial \theta V_s'$ | 0 | 0.0067 | 1.75 | 1.7836 | 0 | 0.0185 |
| $\partial \theta V_r'$ | 1.75 | 1.7601 | 0 | 0.0603 | 1.75 | 1.7536 |
| $\partial \theta I_s'$ | 0 | −0.0001 | 0 | −0.0070 | 0 | −0.0070 |
| $\partial V_s$ | 10 | 10.0161 | 10 | 10.0891 | 10 | 10.0033 |
| $\partial V_r$ | 10 | 10.0154 | 10 | 10.0894 | 10 | 10.0034 |
| $\partial I_s$ | 10 | 9.9647 | 10 | 10.0591 | 10 | 9.9328 |
| $\partial I_r$ | 0 | −0.3783 | 10 | 9.9659 | 10 | 9.6749 |
| $\partial \theta'_{V_s}$ | 0 | 0.0579 | 0 | 0.0138 | 1.75 | 1.7731 |
| $\partial \theta'_{V_r}$ | 1.75 | 1.7937 | 1.75 | 1.7522 | 1.75 | 1.7757 |
| $\partial \theta'_{I_s}$ | 1.75 | 1.7663 | 1.75 | 1.7698 | 1.75 | 1.7676 |

B. Case II: One Referenced Impedance has Error

The second case study considers error in one of the referenced impedances. Towards this goal, errors are added to each of the referenced impedances, one at a time, and different combinations of bias errors are considered for PMU measurements. For space consideration, only the result for a representative case is presented below. And in this particular case, a −2% error is considered for the series resistance, $R_{EMS}$, and 0.01 p.u. bias error is added to magnitude of the sending-end current phasor. A 20% error band is considered for the referenced impedances with α being set to 20%. The proposed approach scans all 4-dimensional data points collected from matrix F', and for visualization purpose, only the relationship between bias errors and errors in R is plotted as shown in FIG. 9. The dashed line marks the outcome of DBSCAN and the X-axis gives the corresponding error in $R_{EMS}$. To help illustrate the DBSCAN process, FIG. 10 visualizes the corresponding DBSCAN clustering results, in terms of size of the cluster and searching distance. Final results are summarized in Table IV.

TABLE IV

TEST RESULTS FOR CASE II

|  | True | Calculated | Calculated Error in | | |
|---|---|---|---|---|---|
|  |  |  | R | X | $B_C$ |
|  | p.u. or rad ($\times 10^{-3}$) |  | (%) | (%) | (%) |
| $\partial V_s$ | 0 | 0.0230 | −2.02 | 0.01 | −0.01 |
| $\partial V_r$ | 0 | 0.0345 |  |  |  |
| $\partial I_s$ | 10 | 10.0328 |  |  |  |
| $\partial I_r$ | 0 | −0.0175 |  |  |  |
| $\partial \theta'_{V_s}$ | 0 | 0.0224 |  |  |  |
| $\partial \theta'_{V_r}$ | 0 | 0.0130 |  |  |  |
| $\partial \theta'_{I_s}$ | 0 | −0.0149 |  |  |  |

According to Table IV, the proposed approach successfully identifies not only bias error in PMU measurements but also error in the referenced TL series resistance.

C. Case III: Two Referenced Impedances have Errors

In the third case study, −4% error and −6% error are considered for $R_{EMS}$ and $X_{EMS}$, respectively; bias errors of 0.01 p.u. and 0.00175 rad are added to $V_s$ and $\theta_{V_r}$, respectively. A 20% error band is considered for the referenced impedances with α being set to 20%.

To help illustrate the DBSCAN process, FIG. 11 visualizes the clustering results, in terms of size of the cluster and searching distance. Both errors in the referenced impedances and the bias errors in PMU measurements are successfully identified. Final results are summarized in Table V.

TABLE V

TEST RESULTS FOR CASE III

|  | True | Calculated | Calculated Error in | | |
|---|---|---|---|---|---|
|  |  |  | R | X | $B_C$ |
|  | p.u. or rad ($\times 10^{-3}$) |  | (%) | (%) | (%) |
| $\partial V_s$ | 10 | 10.0612 | −4.2 | −5.8 | 0.02 |
| $\partial V_r$ | 0 | 0.0334 |  |  |  |
| $\partial I_s$ | 0 | 0.0316 |  |  |  |
| $\partial I_r$ | 0 | 0.1591 |  |  |  |
| $\partial \theta'_{V_s}$ | 0 | 0.0036 |  |  |  |
| $\partial \theta'_{V_r}$ | 1.75 | 1.7617 |  |  |  |
| $\partial \theta'_{I_s}$ | 0 | 0.0047 |  |  |  |

D. Case IV: All Referenced Impedance Values have Errors

In the fourth case study, a set of −2%, −5%, 2% errors are considered for $R_{EMS}$, $X_{EMS}$, and $B_{EMS}$, respectively; bias errors of 0.01 p.u. and 0.00175 rad are added to $V_s$ and $\theta V_r$, respectively. A 20% error band is considered for the referenced impedances with a being set to 20%. Experimental results are shown in Table VI. Table VI demonstrate again the effectiveness of the proposed method when all referenced impedance values have errors. One key value of the proposed approach lies in its capability of PMU calibration without knowing an accurate system model.

TABLE VI

TEST RESULTS FOR CASE IV

|  | True | Calculated | Calculated Error in | | |
|---|---|---|---|---|---|
|  |  |  | R | X | $B_C$ |
|  | p.u. or rad ($\times 10^{-3}$) |  | (%) | (%) | (%) |
| $\partial V_s$ | 10 | 10.0143 | −2.1 | −5.2 | 2.2 |
| $\partial V_r$ | 0 | 0.0054 |  |  |  |
| $\partial I_s$ | 0 | −0.0375 |  |  |  |
| $\partial I_r$ | 0 | −0.0846 |  |  |  |
| $\partial \theta'_{V_s}$ | 1.75 | 1.7967 |  |  |  |
| $\partial \theta'_{V_r}$ | 0 | −0.0437 |  |  |  |
| $\partial \theta'_{I_s}$ | 0 | −0.0091 |  |  |  |

E. Case V: Experiment Using Real PMU Data

In the fifth case study, PMU data are collected for a 500-kV transmission line in Jiangsu Electricity Power Grid with the name of "Huadong-Tianhui Line #5621". PMU data reporting rate is 25 samples per second.

Using these real PMU data, the proposed approach is applied to identify both errors from EMS database and bias errors in the measured phasors. As discussed above, cluster size and searching distance, e, are used as the criteria for DBSCAN. Part of the spatial clustering results are visualized in FIG. 12, which shows the relationship between errors in the reference values of R, X, and $B_c$, and the cluster size. As shown in FIG. 12, the top three points with the largest cluster size are A1~A3, of which A2 has the smallest searching distance. The final results are summarized in Table VII. The results show:

1) TL impedance parameters, R, X and Bc in the EMS database have errors of −14%, 5.4% and 12.6% respectively;

2) no significant bias error in the voltage phasors collected from the real PMU is identified;

3) bias errors of 0.0171 pu and 0.0164 pu are identified in the magnitudes of sending-end and receiving-end current phasors, respectively;

4) no significant bias error is identified in the phase angles of the two current phasors.

TABLE VII

TEST RESULTS FOR CASE V

|  | Calculated p.u. or rad (×10⁻³) | Calculated Error in | | |
|---|---|---|---|---|
|  |  | R (%) | X (%) | $B_C$ (%) |
| $\partial V_s$ | −0.0032 | −14.0 | 6.4 | 12.6 |
| $\partial V_r$ | −0.0033 |  |  |  |
| $\partial I_s$ | 0.0171 |  |  |  |
| $\partial I_r$ | 0.0164 |  |  |  |
| $\partial \theta'_{Vs}$ | 0.0003 |  |  |  |
| $\partial \theta'_{Vr}$ | 0.0027 |  |  |  |
| $\partial \theta'_{Is}$ | −5.6238e−5 |  |  |  |

Computation time of the proposed approach is dependent upon the number of data points to scan within the feasibility region. In one experiment, a total of 1 million points (worst case scenario) are processed using a Matlab program, and the solution process takes roughly 29 seconds (recoding the program using C++ will greatly speed up the solution process). Fortunately, PMU data calibration does not need to be conducted very often, and once a week or longer will work for most cases. Structure of the proposed algorithm is suitable for parallel processing, which will further speed up the solution process.

This invention can be implemented in hardware, firmware or software, or a combination of the three. Preferably the invention is implemented in a computer program executed on a programmable computer having a processor, a data storage system, volatile and non-volatile memory and/or storage elements, at least one input device and at least one output device.

By way of example, a block diagram of a computer to support the system is discussed next. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

The invention has been described herein in considerable detail in order to comply with the patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

These are key steps of this invention:
1. Least square estimator construction based on PI model, PMU measurements and TL parameters from EMS;
2. Set confidential interval to EMS data;
3. Estimation result data clustering using DBSCAN;
4. Cluster filter targeting the answer indicates bias errors in PMU measurements.

More detailed steps of this invention:
1) scan every point within feasible region (a total of M points);
2) evaluate the corresponding bias errors in the PMU measurements;
3) form sets of points with each set containing seven 4-dimensional data points, and each data point has the form of ($\partial R$, $\partial X$, $\partial B\_c$, x), where x is one of the bias errors in PMU measurements (a total of M sets);
4) apply DBSCAN to cluster all the M data sets to find out the one with least number of outliers (maximum number of core and reachable points) and minimum searching distance;
5) determine actual bias errors in all PMU channels and errors in line impedance references after the cluster is identified in step 4).

IV. Conclusion and Advantages

The invention proposes a data mining and least square estimation combination framework to determine the overall systematic or bias error(s) introduced by PMU and its instrumentation channel. The least square estimator is built based on general TL PI model. In this estimation, TL parameters are equally critical to the result as synchrophasor measurements. For most power systems, detailed TL specifications can be found from their affiliated utility's Energy Management System (EMS). However, the accuracy level of EMS data is even lower than PMU data itself, a sensitivity analysis we conducted shows: 1) TL parameter accuracy is essentially and linearly influential to the state estimation result; 2) the more accurate the TL parameter is the more disperse the erroneous synchrophasor measurements are from the good synchrophasor measurements. These two features recall a clustering algorithm called density-based spatial clustering of applications with noise (DBSCAN), this algorithm is capable of effectively filtering out the true synchrophasor bias errors from the massive estimation result despite the inaccurate TL parameters. This invention presents a novel approach for online calibration of PMU by using density-based spatial clustering. As compared to existing methods, this invention has two major advantages: 1) it identifies the overall bias errors introduced by both PMU and its instrumentation channel; 2) it does not require accurate system model/parameters. Therefore, it is applicable across a wide spectrum of practical conditions. In addition, one by-product of the proposed approach is more accurate TL impedance estimates for improved system modeling, more accurate protective relay settings, and other related applications. Future more, this invention could: 1) extend the invented framework to system level to achieve simultaneous calibration of multiple PMUs; 2) decompose the spatial clustering process so that state-of-the-art parallel computing techniques can be employed to speed up the computation.

This invention has the following advantages:

1) Easier to implement, and cheaper in cost:
   No additional measurement equipment is needed; Labors are saved since this invention leads to an automatic calibration.

2) Faster operation: Online synchrophasor measurements data can be directly imported into this calibration program and monitoring the PMU accuracy.

3) Additional commercial value:
   The byproduct of this invention is more accurate impedance parameters of the TL for EMS database, which can benefit utilities on power flow modeling, protective relay settings and other related work.

The framework of this bias error detection method is unique; it basically combined the least square estimation and the clustering algorithm DBSCAN. The interactive of these two tools can effectively detect the bias errors.

The calibration process is also unique, it purely based on existing data like PMU measurements and TL parameters from EMS, no additional assumptions or calibration devices are needed. This method can solve two problems at one time. Beside bias error calibration, it also can identify the true transmission line parameters.

V. Appendix I

Partial derivatives of impedance to the PMU measurements are presented as follows:

$$\frac{\partial Z}{\partial V_s} = -\frac{2 V_s e^{2i\theta'_{Vs}}}{I_r V_s e^{i\theta'_{Vs}} - I_s V_r e^{i(\theta'_{Vr}+\theta'_{Is})}} - \frac{I_r e^{i\theta'_{Vs}}(V_r^2 e^{2i\theta'_{Vr}} - V_s^2 e^{2i\theta'_{Vs}})}{(I_r V_s e^{i\theta'_{Vs}} - I_s V_r e^{i(\theta'_{Vr}+\theta'_{Is})})^2} \quad (22)$$

$$\frac{\partial Z}{\partial V_r} = \frac{2 V_r e^{2i\theta'_{Vr}}}{I_r V_s e^{i\theta'_{Vs}} - I_s V_r e^{i(\theta'_{Vr}+\theta'_{Is})}} + \frac{I_s e^{i(\theta'_{Vr}+\theta'_{Is})}(V_r^2 e^{2i\theta'_{Vr}} - V_s^2 e^{2i\theta'_{Vs}})}{(I_r V_s e^{i\theta'_{Vs}} - I_s V_r e^{i(\theta'_{Vr}+\theta'_{Is})})^2} \quad (23)$$

$$\frac{\partial Z}{\partial I_s} = \frac{V_r e^{i(\theta'_{Vr}+\theta'_{Is})}(V_r^2 e^{2i\theta'_{Vr}} - V_s^2 e^{2i\theta'_{Vs}})}{(I_r V_s e^{i\theta'_{Vs}} - I_s V_r e^{i(\theta'_{Vr}+\theta'_{Is})})^2} \quad (24)$$

$$\frac{\partial Z}{\partial I_r} = -\frac{V_s e^{i\theta'_{Vs}}(V_r^2 e^{2i\theta'_{Vr}} - V_s^2 e^{2i\theta'_{Vs}})}{(I_r V_s e^{i\theta'_{Vs}} - I_s V_r e^{i(\theta'_{Vr}+\theta'_{Is})})^2} \quad (25)$$

$$\frac{\partial Z}{\partial \theta'_{Vs}} = -\frac{2i V_s^2 e^{2i\theta'_{Vs}}}{I_r V_s e^{i\theta'_{Vs}} - I_s V_r e^{i(\theta'_{Vr}+\theta'_{Is})}} - \frac{i I_r V_s e^{i\theta'_{Vs}}(V_r^2 e^{2i\theta'_{Vr}} - V_s^2 e^{2i\theta'_{Vs}})}{(I_r V_s e^{i\theta'_{Vs}} - I_s V_r e^{i(\theta'_{Vr}+\theta'_{Is})})^2} \quad (26)$$

$$\frac{\partial Z}{\partial \theta'_{Vr}} = \frac{2i V_r^2 e^{2i\theta'_{Vr}}}{I_r V_s e^{i\theta'_{Vs}} - I_s V_r e^{i(\theta'_{Vr}+\theta'_{Is})}} - \frac{i I_s V_r e^{i(\theta'_{Vr}+\theta'_{Is})}(V_r^2 e^{2i\theta'_{Vr}} - V_s^2 e^{2i\theta'_{Vs}})}{(I_r V_s e^{i\theta'_{Vs}} - I_s V_r e^{i(\theta'_{Vr}+\theta'_{Is})})^2} \quad (27)$$

$$\frac{\partial Z}{\partial \theta'_{Is}} = \frac{i I_s V_r e^{i(\theta'_{Vr}+\theta'_{Is})}(V_r^2 e^{2i\theta'_{Vr}} - V_s^2 e^{2i\theta'_{Vs}})}{(I_r V_s e^{i\theta'_{Vs}} - I_s V_r e^{i(\theta'_{Vr}+\theta'_{Is})})^2} \quad (28)$$

$$A_R = \text{real}\left(\frac{\partial Z}{\partial V_s}\right), A_X = \text{imag}\left(\frac{\partial Z}{\partial V_s}\right), B_R = \text{real}\left(\frac{\partial R}{\partial V_r}\right),$$

$$B_X = \text{imag}\left(\frac{\partial R}{\partial V_r}\right), C_R = \text{real}\left(\frac{\partial Z}{\partial I_s}\right), C_X = \text{imag}\left(\frac{\partial Z}{\partial I_s}\right),$$

$$D_R = \text{real}\left(\frac{\partial Z}{\partial I_r}\right), D_X = \text{imag}\left(\frac{\partial Z}{\partial I_r}\right), E_R = \text{real}\left(\frac{\partial Z}{\partial \theta'_{Vs}}\right),$$

$$E_X = \text{imag}\left(\frac{\partial Z}{\partial \theta'_{Vs}}\right), F_R = \text{real}\left(\frac{\partial Z}{\partial \theta'_{Vr}}\right), F_X = \text{imag}\left(\frac{\partial Z}{\partial \theta'_{Vr}}\right),$$

$$G_R = \text{real}\left(\frac{\partial Z}{\partial \theta'_{Is}}\right), G_X = \text{imag}\left(\frac{\partial Z}{\partial \theta'_{Is}}\right).$$

By the same means, the partial derivative equations of Y to each PMU components can be generated and $A_B$, $B_B$ ... $G_B$ can be calculated accordingly. Due to the space limitation, they are not presented here.

VI. Appendix II

A transmission line with two PMUs installed at both terminals is simulated in this study using Matlab/Simulink with specifications shown in Table VIII.

TABLE VIII

SPECIFICATIONS OF THE SIMULATED TRANSMISSION LINE

| Variables | Description, Unit | Value |
| --- | --- | --- |
| $R_{line}$ | line resistance, Ω/km | 0.013333 |
| $L_{line}$ | line inductances, H/km | 7.4342e−4 |
| $C_{line}$ | line capacitances, F/km | 1.0001e−8 |
| D | length of line, km | 150 |
| $f_{source}$ | source frequency, Hz | 60 |
| Voltage level | kV | 500 |

VII. References

[1] D. Shi, D. J. Tylaysky, and N. Logic, "An Adaptive Method for Detection and Correction of Errors in PMU Measurements," *IEEE Trans. Smart Grid*, vol. 3, no. 4, Dec. 2012.

[2] North American SynchroPhasor Initiative Performance & Standards Task Team, "Synchrophasor Measurement Accuracy Characterization," November 2007.

[3] North American SynchronPhasor Initiatibe (NASPI), Performance and Standards Task Team (PSTT), "PMU System Testing and Calibration Guide", Nov. 5, 2007.

[4] *IEEE Standard for Synchrophasor Measurements for Power Systems*, IEEE Std C37. 118. 1™-2011.

[5] P. Komarnicki, C. Dzienis, Z. A. Styczynski, J. Blumschein, and V. Centeno, "Practical Experience with PMU System Testing and Calibration Requirements," *IEEE PES General Meeting*, 2008.

[6] K. Narendra, Z. Zhang, J. Lane, B. Lackey and E. Khan, "Calibration and Testing of TESLA Phasor Measurement Unit (PMU) Using Double F6150 Test Instrument," *Bulk Power System Dynamics and Control—VII. Revitalizing Operational Reliability*, 2007 iREP Symposium, pp. 1-13, August 2007.

[7] G. Stenbakken and T. Nelson, "Static Calibration and Dynamic Characterization of PMUs at NIST," *IEEE PES General Meeting*, pp. 1-4, June 2007.

[8] G. Stenbakken and M. Zhou, "Dynamic Phasor Measurement Unit Test System," *IEEE PES General Meeting*, pp. 1-8, June 2007.

[9] G. Stenbakken, T. Nelson, M. Zhou and V. Centeno, "Reference Values for Dynamic Calibration of PMUs," *Proceedings of the 41st Hawaii International Conference on System Sciences*, pp. 1-6, January 2008.

[10] Y. Hu and D. Novosel, "Progresses in PMU Testing and Calibration," in *Proc. 3rd Int. Con. on Electric Utility Deregulation and Restructuring and Power Technologies*, Nanjing, pp. 150-155, 2008.

[11] R. Pirret, "Testing and Calibration of Phasor Measurement Units," *Technical note*, Fluke Calibration, 2013.

[12] L. Vanfretti, J. H. Chow, S. Sarawgi, and B. Fardanesh, "A Phasor-data-based State Estimator Incorporating Phase Bias Correction," *IEEE Trans. Power Syst.*, vol. 26, pp. 111-119, February 2011.

[13] A. P. S. Meliopoulos, G. J. Cokkinides, F. Galvan, and B. Fardanesh, "GPS-Synchronized Data Acquisition: Technology Assessment and Research Issues," *Proceedings of the 39th Annual Hawaii International Conference on System Science*, Hawaii, Jan. 4-7, 2006.

[14] Q. Zhang, V. Vittal, G. Heydt, etc., "The Integrated Calibration of Synchronized Phasor Measurement Data in Power Transmission Systems," *IEEE Trans. Power Deliery*, vol. 26, no. 4, pp. 2573-2581, 2011.

[15] Z. Wu, L. Zora, and A. G. Phadke, "Simultaneous Transmission Line Parameter and PMU Measurement Calibration," *IEEE PES General Meeting*, 2015.

[16] D. Ritzmann, P. S. Wright, W. Holderbaum, etc., "A Method for Accurate Transmission Line Impedance Parameter Estimation," *IEEE Trans. Instru. and Meas.*, vol. 65, no. 10, October 2016.

[17] P. Castello, M. Lixia, C. Muscas, and P. A. Pegoraro., "Impact of the Model on the Accuracy of Synchrophasor Measurement," IEEE Trans. Instr. and Meass, vol. 61, no. 8, pp. 2179-2188, August 2012.

[18] D. Shi, D. J. Tylavsky, K. Koellner, N. Logic, and D. E. Wheeler, "Transmission Line Parameters Identification Using PMU Measurements," *Eur. Trans. Elect. Power*, vol. 21, no. 4, pp. 1574-1588, 2011.

[19] C. S. Indulkar and K. Ramalingam, "Estimation of Transmission Line Parameters from Measurements," *Int. J. Elect. Power Energy Syst.*, vol. 30, no. 5, pp. 337-342, June 2008.

[20] C. Borda, A. Olarte, and H. Diaz, "PMU-based Line and Transformer Parameter Estimation," in *Proc. IEEE/PES Power Syst. Conf. Expo.*, March 2009, pp. 1-8.

[21] K. Dasgupta and S. A. Soman, "Line Parameter Estimation Using Phasor Measurements by the Total Least Squares Approach," in *Proc. IEEE Power Energy Soc. General Meeting*, pp. 1-5, July 2013.

[22] L. Philippot and J. C. Maun, "An Application of Synchronous Phasor Measurement to the Estimation of the Parameters of an Overhead Transmission Line," in *Proc. Conf. Fault Disturbance Anal. Precise Meas. Power Syst.*, Arlington, Va., pp. 1-5, November 1995.

[23] A. M. Dán and D. Raisz, "Estimation of Transmission Line Parameters Using Wide-area Measurement Method," in *Proc. IEEE Trondheim PowerTech*, pp. 1-6, June 2011.

[24] J. Zaborszky and J. W. Rittenhouse, *Electric Power Transmission: The Power System in the Steady State*. New York, N.Y., USA: Ronald, 1954.

[25] Cauchy-Riemann Equations. [Online]. Available at: http://en.wikipedia.org/wiki/Cauchy%E2%80%93Riemann_equations.

[26] D. Shi, *Utilizing Synchrophasor Technology to Determine Transmission Line Impedance Parameters*, Arizona State University, 2009.

[27] H. Zhou, X. Zhao, D. Shi, etc., "Calculating Sequence Impedances of Transmission Line Using PMU Measurements," 2015 *IEEE Power & Energy Society General Meeting*, 2015.

[28] M. Ester, H. P. Kriegel, J. Sander, and X. Xu, "A Density-Based Algorithm for Discovering Clusters in Large Spatial Databases with Noise," Kdd., vol. 96, no. 34, 1996.

In summary, the present invention provides a novel approach for online calibration of PMU by using density-based spatial clustering. Although the potential methods and applications of using the same according to the present invention have been described in the foregoing specification with considerable details, it is to be understood that modifications may be made to the invention which do not exceed the claimed scope of the invention and modified forms of the present invention done by others skilled in the art to which the invention pertains will be considered infringements of this invention when those modified forms fall within the claimed scope of this invention.

What is claimed is:

1. A method of online calibration of Phasor Measurement Unit (PMU) by using Density-Based Spatial Clustering of Applications with Noise (DBSCAN) approach with relaxed assumptions, the method comprising the following steps:

1) collecting voltage phasors, $\overline{V}_s$, and $\overline{V}_r$, and current phasors, $\overline{I}_s$ and $\overline{I}_r$, from each end of a transmission line, where a sending end of the transmission line is denoted as s and a receiving end of the transmission line is denoted as r;

2) calculating transmission line values including series resistance R, series reactance X, and shunt susceptance $B_c$, by solving a set of nodal equations (3)-(4), whose solution is given by a set of transmission line nodal equations (9)-(11);

$$\overline{I}_s - \overline{V}_s \cdot \frac{Y}{2} + \overline{I}_r - \overline{V}_r \cdot \frac{Y}{2} = 0 \qquad (3)$$

$$\overline{V}_s - Z \cdot \left(\overline{I}_s - \overline{V}_s \cdot \frac{Y}{2}\right) - \overline{V}_r = 0 \qquad (4)$$

$$R = \text{real}\left(\frac{V_s^2 e^{i2\theta'_{V_s}} - V_r^2 e^{i2\theta'_{V_r}}}{I_s \cdot V_r e^{i(\theta'_{I_s} + \theta'_{V_r})} - I_r \cdot V_s e^{i\theta'_{V_s}}}\right) \qquad (9)$$

$$X = \text{imag}\left(\frac{V_s^2 e^{i2\theta'_{V_s}} - V_r^2 e^{i2\theta'_{V_r}}}{I_s \cdot V_r e^{i(\theta'_{I_s} + \theta'_{V_r})} - I_r \cdot V_s e^{i\theta'_{V_s}}}\right) \qquad (10)$$

$$B_c = \text{imag}\left(2 \cdot \frac{I_s e^{i\theta'_{I_s}} + I_r}{V_s e^{i\theta'_{V_s}} + V_r e^{i\theta'_{V_r}}}\right) \qquad (11)$$

3) obtaining reference values of series resistance $R_{EMS}$, series reactance $X_{EMS}$, and shunt susceptance $B_{EMS}$ from an Energy Management System (EMS) database and comparing the calculated transmission line values (R, X, $B_c$) to the EMS reference values ($R_{EMS}$, $X_{EMS}$, $B_{EMS}$) to generate difference values ($\partial R$, $\partial X$, and $\partial B_c$), between the calculated transmission line values (R, X, $B_c$) and the EMS reference values ($R_{EMS}$, $X_{EMS}$, $B_{EMS}$), where $\partial R = R - R_{EMS}$, $\partial X = X - X_{EMS}$, $\partial B_c = B_c - B_{EMS}$;

4) linearizing equations (9)-(11) to identify a relationship between bias errors in PMU measurements ($\partial V_s$, $\partial V_r$, $\partial I_s$, $\partial I_r$, $\partial \theta'_{V_s}$, $\partial \theta'_{V_r}$, and $\partial \theta'_{I_s}$) and differences in the calculated difference values (∂R, ∂X, and ∂B$_c$), wherein equations (9)-(11) are linearized by taking the partial derivative of the calculated transmission line values (R, X, B$_c$) with respect to each of the PMU measurements (V$_s$, V$_r$, I$_s$, I$_r$, θ'$_{V_s}$, θ'$_{V_r}$, and θ'$_{I_s}$), where the linearized equations (9)-(11) are represented using equations (12)-(14), given at least three sets of difference values (∂R, ∂X, and ∂B$_c$), the bias error in PMU measurements can be calculated using $$\partial R = A_R \cdot \partial V_s + B_R \cdot \partial V_r + C_R \cdot \partial I_s + D_R \cdot \partial I_r + E_R \cdot \partial \theta'_{V_s} + F_R \cdot \partial \theta'_{V_r} + G_R \cdot \partial \theta'_{I_s} \quad (12)$$

$$\partial X = A_X \cdot \partial V_s + B_X \cdot \partial V_r + C_X \cdot \partial I_s + D_X \cdot \partial I_r + E_X \cdot \partial \theta'_{V_s} + F_X \cdot \theta'_{V_r} + G_X \cdot \partial \theta'_{I_s} \quad (13)$$

$$\partial B_C = A_B \cdot \partial V_s + B_B \cdot \partial V_r + C_B \cdot \partial I_s + D_B \cdot \partial I_r + E_B \cdot \partial \theta'_{V_s} + F_X \cdot \partial \theta'_{V_r} + G_X \cdot \partial \theta'_{I_s} \quad (14)$$

or, where at least three sets of PMU measurements (V$_s$, V$_r$, I$_s$, I$_r$, θ'$_{V_s}$, θ'$_{V_r}$, and θ'$_{I_s}$), are provided, using a matrix described by equation (15) to identify the relationship between bias errors in the PMU measurements (∂V$_s$, θV$_r$, ∂I$_s$, ∂I$_r$, ∂θ'$_{V_s}$, ∂θ'$_{V_r}$, and ∂θ'$_{I_s}$) and the differences in the calculated difference values (∂R, ∂X, and ∂B$_c$), and finally solving equation (15) with a solution given by equation (19), $$\begin{bmatrix} \partial R \\ \partial X \\ \partial B_c \end{bmatrix} = \begin{bmatrix} A_R & B_R & C_R & D_R & E_R & F_R & G_R \\ A_X & B_X & C_X & D_X & E_X & F_X & G_X \\ A_B & B_B & C_B & D_B & E_B & F_B & G_B \end{bmatrix} \cdot \begin{bmatrix} \partial V_s \\ \partial V_r \\ \partial I_s \\ \partial I_r \\ \partial \theta'_{V_s} \\ \partial \theta'_{V_r} \\ \partial \theta'_{I_s} \end{bmatrix} \quad (15)$$

$$F = (H^T H)^{-1} H^T E \quad (19);$$

5) creating a feasible region for each EMS reference value (R$_{EMS}$, X$_{EMS}$, B$_{EMS}$), and varying each EMS reference value (R$_{EMS}$, X$_{EMS}$, B$_{EMS}$) within its corresponding feasible region to generate a new set of EMS reference values (R$_{EMS}$, X$_{EMS}$, B$_{EMS}$), then calculating difference values (∂R, ∂X, and ∂B$_c$) based on each set of new EMS reference values (R$_{EMS}$, X$_{EMS}$, B$_{EMS}$) and calculating corresponding bias errors in the PMU measurements (∂V$_s$, θV$_r$, ∂I$_s$, ∂I$_r$, ∂θ'$_{V_s}$, ∂θ'$_{V_r}$, and ∂θ'$_{I_s}$) by solving equation (21), where equation (21) comprises an extended equation (15), $$\begin{bmatrix} \partial V_s^1 & \partial V_s^2 & & \partial V_s^M \\ \partial V_r^1 & \partial V_r^2 & & \partial V_r^M \\ \partial I_s^1 & \partial I_s^2 & \ldots & \partial I_s^M \\ \partial I_r^1 & \partial I_r^2 & \ldots & \partial I_r^M \\ \partial \theta_s'^1 & \partial \theta_s'^2 & \ldots & \partial \theta_s'^M \\ \partial \theta_r'^1 & \partial \theta_r'^2 & & \partial \theta_r'^M \\ \partial \theta_{I_s}'^1 & \partial \theta_{I_s}'^2 & & \partial \theta_{I_s}'^M \end{bmatrix} = (H^T H)^{-1} H^T \begin{bmatrix} \partial R_1^1 & \partial R_1^2 & & \partial R_1^M \\ \partial X_1^1 & \partial X_1^2 & & \partial X_1^M \\ \partial B_{c1}^1 & \partial B_{c1}^2 & & \partial B_{c1}^M \\ \partial R_2^1 & \partial R_2^2 & & \partial R_2^M \\ \partial X_2^1 & \partial X_2^2 & \ldots & \partial X_2^M \\ \partial B_{c2}^1 & \partial B_{c2}^2 & \ldots & \partial B_{c2}^M \\ \vdots & \vdots & \ldots & \vdots \\ \vdots & \vdots & & \vdots \\ \vdots & \vdots & & \vdots \\ \partial R_N^1 & \partial R_N^2 & & \partial R_N^M \\ \partial X_N^1 & \partial X_N^2 & & \partial X_N^M \\ \partial B_{cN}^1 & \partial B_{cN}^2 & & \partial B_{cN}^M \end{bmatrix} \quad (21)$$

6) applying a DBSCAN algorithm to cluster each set of bias errors in the PMU measurements (∂V$_s$, θV$_r$, ∂I$_s$, ∂I$_r$, ∂θ'$_{V_s}$, ∂θ'$_{V_r}$, and ∂θ'$_{I_s}$) and recording a cluster size and a minimum searching distance for each cluster C;

7) evaluating the clustering results for each set of bias errors in the PMU measurements (∂V$_s$, ∂V$_r$, ∂I$_s$, ∂I$_r$, ∂θ'$_{V_s}$, ∂θ'$_{V_r}$, and ∂θ'$_{I_s}$) to find at least one cluster C of a group of clusters C=[C$_1$, C$_2$, ..., C$_n$] with a biggest cluster size; and 8)) determining searching distance of all clusters of C to find a cluster C$_m$ with the minimum searching distance, wherein bias errors in the PMU measurements (∂V$_s$, ∂V$_r$, ∂I$_s$, ∂I$_r$, ∂θ'$_{V_s}$, ∂θ'$_{V_r}$, and ∂θ'$_{I_s}$) corresponding to the minimum searching distance cluster C$_m$ represent true bias errors of the PMU measurements (∂V$_s$, ∂V$_r$, ∂I$_s$, ∂I$_r$, ∂θ'$_{V_s}$, ∂θ'$_{V_r}$, and ∂θ'$_{I_s}$) and the corresponding values of R$_{EMS}$, X$_{EMS}$, and B$_{EMS}$ represent true values of the transmission line values.

2. The method of online calibration of Phasor Measurement Unit (PMU) in claim 1, wherein the method identifies the overall bias errors introduced by both PMU and its instrumentation channel.

* * * * *